(12) United States Patent
Resta et al.

(10) Patent No.: US 7,869,267 B2
(45) Date of Patent: Jan. 11, 2011

(54) METHOD FOR LOW POWER ACCESSING A PHASE CHANGE MEMORY DEVICE

(75) Inventors: Claudio Resta, Pavia (IT); Ferdinando Bedeschi, Agrate (IT)

(73) Assignee: Numonyx B.V., Rolle (CH)

( * ) Notice: Subject to any disclaimer, the term of this patent is extended or adjusted under 35 U.S.C. 154(b) by 171 days.

(21) Appl. No.: 12/345,411

(22) Filed: Dec. 29, 2008

(65) Prior Publication Data
US 2010/0165713 A1 Jul. 1, 2010

(51) Int. Cl.
*G11C 11/00* (2006.01)
(52) U.S. Cl. .................. 365/158; 365/163; 365/171; 365/173
(58) Field of Classification Search .......... 365/158, 365/163, 171, 173
See application file for complete search history.

(56) References Cited

U.S. PATENT DOCUMENTS 7,203,087 B2 * 4/2007 Resta et al. ................. 365/148
7,283,387 B2 * 10/2007 Cho et al. .................... 365/163
7,778,079 B2 * 8/2010 Jeong et al. ............ 365/185.14

* cited by examiner

*Primary Examiner*—Pho M Luu
(74) *Attorney, Agent, or Firm*—Blakely, Sokoloff, Taylor & Zafman LLP

(57) ABSTRACT

A method for accessing a phase change memory device, wherein a first sub-plurality of bitlines is grouped in a first group and a second sub-plurality of bitlines is grouped in a second group. At least a bitline in the first and second groups are selected; currents are supplied to the selected bitlines; and a selected wordline is biased. The bitlines are selected by selecting a first bitline in the first group and, while the first bitline is selected, selecting a second bitline in the second group which is arranged on the selected wordline symmetrically to the first bitline in the first group.

13 Claims, 6 Drawing Sheets

METHOD FOR LOW POWER ACCESSING A PHASE CHANGE MEMORY DEVICE

BACKGROUND OF THE INVENTION

1) Field of the Invention

Embodiments of the present invention relate to a method for low power accessing a phase change memory device.

2) Description of Related Art

As is known, phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change material is non-volatile, absent application of excess temperatures, such as those in excess of 150° C., for extended times. Therefore, when a memory element is set in either a crystalline semi-crystalline, amorphous, or semi-amorphous state, each of them associated with a different resistance value, that value is retained until reprogrammed, even if power is removed. Thus, data can be stored in the memory elements in form of respective resistance levels associated to different phases of the phase-change material.

Selection elements may be formed according to different technologies, for example they can be implemented by diodes, by MOS transistors or bipolar transistors.

With reference to FIG. 1, a phase-change memory device 1 comprises an array 2 of PCM cells 3, arranged in rows and columns and connected to a column decoder 5 and a row decoder stage 6; a write/read selector 8 connects the column decoder 5 to either a sense stage 9 or a write stage 10, as controlled by control signals (not shown) whose values depend on the operative phase of the phase-change memory device 1.

FIG. 1 also illustrates one exemplar PCM cell 3 of the array 1. All PCM cells 3 are identical and include a phase-change memory element 11 and a cell selector 12 coupled in series. In FIG. 1, the phase-change memory element 11 is illustrated as a resistor having variable resistance level. In the embodiment shown, the cell selector 12 is a PNP bipolar transistor controlled to allow current to flow through the respective phase-change memory element 11 during reading and programming/verifying operations. Each phase-change memory element 11 is directly connected to a respective bit line 15 and is connected to a respective word line 16 through the cell selector 12.

Groups of PCM cells 3 are selectively addressable by the column decoder 5 and the row decoder stage 6. In particular the row decoder stage 6 connects selected word lines 16 to a low voltage (as close as possible to Vss) and unselected word lines 16 to a relatively high voltage (typically 1.3 V during reading and 3.8 V during writing).

FIG. 2 shows a more detailed diagram of the memory array 2. In the embodiment, the memory array 2 is divided into a plurality of tiles 20 (only two whereof are shown in FIG. 2, for sake of clarity), comprising each e.g. 1024 word lines. Each tile 20 is connected to an own local row decoder 21 belonging to the row decoder stage 6. A global row decoder 22 is formed farer from the tiles 20 and generates address signals for the local row decoders 21. Each bitline 15, when deselected, is connected a low voltage Vss through an own pull-down transistor 23 controlled by the respective local row decoder 21.

As shown in FIG. 3, each tile 20 may store a plurality of data for each wordline 16. In the example shown, two data (D0, D1) are stored for each wordline 16, and each datum is stored in $\underline{n}$ cells 3, connected to $\underline{n}$ bitlines 15. Specifically, in the example, bitlines BL<0>-BL<n−1> are associated to D0 and bitlines BL<n>-BL<2n1> are associated to D1 of each wordline. Let's assume, for simplicity, that each cell 3 stores a bit; this means that bitlines BL<0>-BL<n−1> are associated to bit(0)-bit(n−1) of D0 and bitlines BL<n>-BL<2n−1> are associated to bit(0)-bit(n−1) of D1.

In such a situation, parallel writing of D0, D1 on a wordline may require a high write current and cause a high voltage drop on the selected wordline. In fact, writing of a bit is carried out by supplying a write current to the selected bitline 15; this current, divided by the gain of the accessed cell selector 12, flows through the selected wordline 16. Since the gain of the cell selectors 12 is low (of the order of 2-3), the current flowing on the selected wordline is a non-negligible fraction of the write current, and thus is quite high. This wordline current causes a voltage drop on the wordline 16 which depends on the position of the selected cell; thus the voltage on the control terminal of the addressed selector is equal to the sum of the driver voltage Vdr fed by the local row decoder 21 to selected wordline 16 plus the voltage drop on the selected wordline 16.

If both data are to be written simultaneously, the wordline currents on the selected wordline are summed up, further increasing the voltage drop, as below discussed.

Let's consider for example, the simultaneous writing of bit(0) of both D0 and D1 on wordline WL<0>, as shown in FIG. 3. Thus, writing currents are supplied to bitlines BL<0> and BL<n>.

In such a situation, the voltage on the control terminal of cell $3_0$ connected to bitline BL<0> is equal to driver voltage Vdr, since this cell is very close to the local row decoder 21, while the voltage V1 on the control terminal of cell $3_1$ connected to bitline BL<n> is:

$$V1 = Vdr + \tfrac{1}{2}R^*Iw/\beta$$

wherein R is the resistance of the wordline 16, Iw is the writing current supplied to the selected bitline 15 and β is the gain of the transistor forming the cell selector 12.

Let's now consider the simultaneous writing of bit(n−1) of both D0 and D1, as shown in FIG. 4. In such a situation, the current flowing on wordline WL<0> from bitline BL<n−1> to the local row decoder 21 is the sum of the currents injected by both bitlines BL<n−1> and BL<2n−1> divided by the gain β (2Iw/β). In such a situation, the voltage V2 on the control terminal of cell $3_2$ connected to bitline BL<n−1> is due the driver voltage Vdr plus the voltage drop across the portion of the wordline comprised between the local row decoder and bitline BL<n−1>, thus:

$$V2 = Vdr + \tfrac{1}{2}R(2Iw/\beta) = Vdr + R^*Iw/\beta.$$

The voltage V3 on the control terminal of cell $3_3$ connected to bitline BL<2n−1> is equal to V2 plus the voltage drop across the portion of the selected wordline WL<0> comprised between bitline BL<2n−1> and bitline BL<n−1>, due to current Iw/β. Thus:

$$V3 = Vdr + R^*Iw/\beta + \tfrac{1}{2}R^*Iw/\beta = Vdr + (3/2)R^*Iw/\beta.$$

Thus, in the just discussed worst case, where the cells 3 to be written lie at the farthest positions from the local row decoder 21 for each datum, the current flowing along the selected wordline may generate a very high voltage drop on the selected wordline.

Therefore, parallel writing of two data may cause an inacceptable dissipation in the memory array, preventing in practice the parallel writing of more than one datum.

The object of the invention is thus to solve the problem outlined above, and in particular to allow parallel writing of more than one datum each time.

According to embodiments of the present invention, there are provided methods for accessing a phase change memory device and a phase change memory device.

BRIEF DESCRIPTION OF THE DRAWINGS

For the understanding of the present invention, embodiments thereof are now described, purely as a non-limitative example, with reference to the enclosed drawings, wherein.

DETAILED DESCRIPTION OF THE INVENTION

Figure 5:
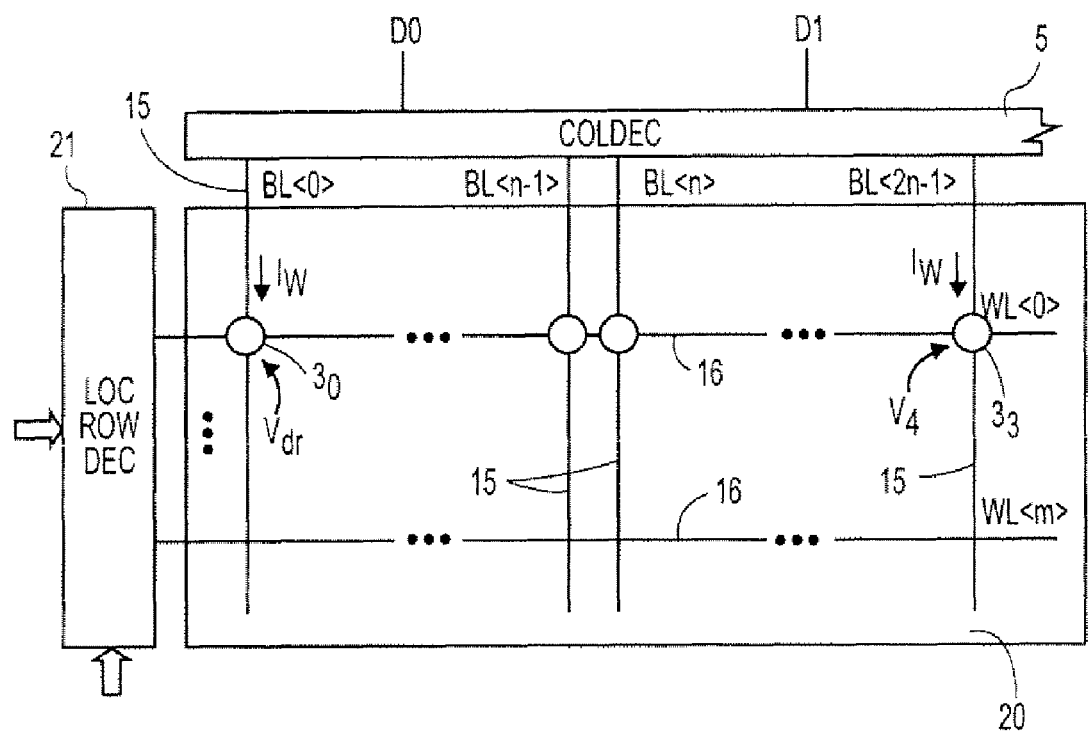
FIGS. 5 and 6 are diagrams of a portion of the memory array of FIG. 2, showing selection of different cells during writing according an embodiment of the present method.
Figure 6:
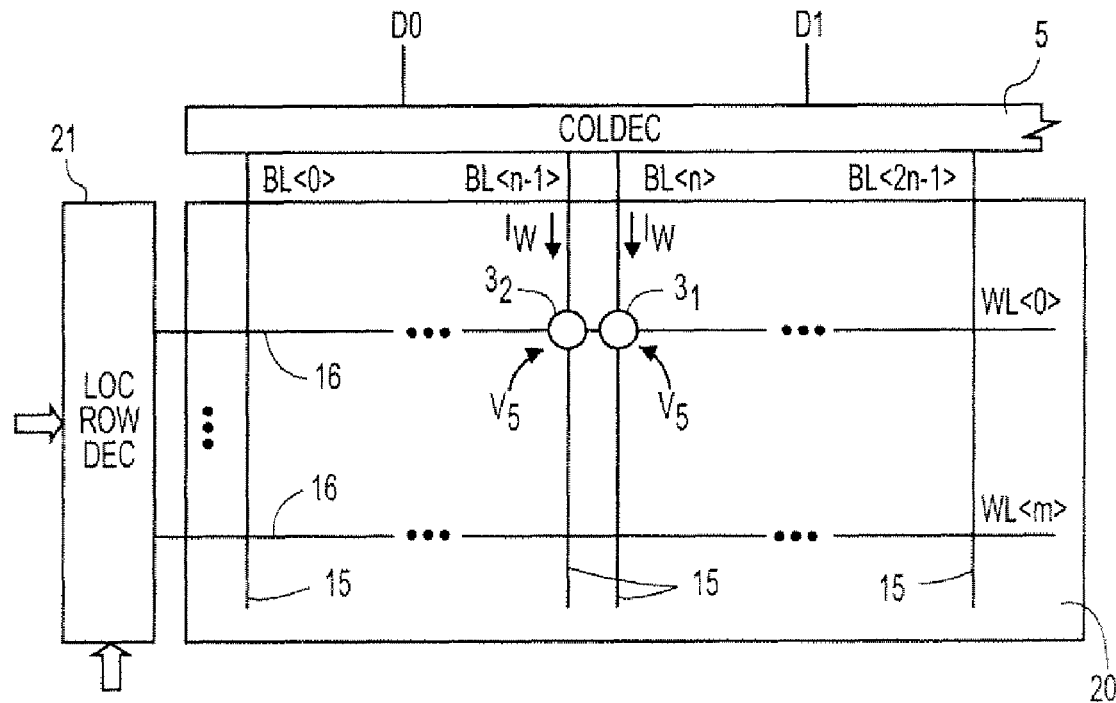

According to FIGS. 5 and 6, the present method of parallel accessing memory cells 3 in an array 2 is based on varying the relative position of the addressed cells for each datum so as to minimize the worst-case current flowing in the selected wordline.

In particular, instead of simultaneously accessing cells in the same relative position within the respective datum, the order is reversed, so that, when the nearest cell $3_0$ of D0 (connected to bitline BL<0>) is accessed, the farthest cell $3_3$ of D1 (connected to bitline BL<2n+1>) is accessed, as shown in FIG. 5.

Furthermore, when the farthest cell $3_2$ of D0 (connected to bitline BL<n−1>) is accessed, the nearest cell $3_1$ of D1 is accessed, as shown in FIG. 6.

In such a case, the voltage on the control terminal of cell $3_0$ connected to bitline BL<0> is again equal to driver voltage Vdr. The voltage V4 on the control terminal of cell $3_3$ connected to bitline BL<2n−1> is here due only to the sum of driver voltage Vdr and the voltage drop due to the single current Iw/β flowing on wordline WL<0> from bitline BL<2n−1> to the local row decoder 21, as injected through cell $3_3$. Thus:

$$V4=Vdr+R*Iw/\beta=V2$$

The voltage V5 on the control terminals of cell $3_2$ and $3_3$ connected to bitlines BL<n−1> and BL<n> is due to the sum of two currents Iw/β which flow along only half of the wordline WL<0>. Thus:

$$V5=Vdr+\tfrac{1}{2}R(2Iw/\beta)=Vdr+R*Iw/\beta=V4<V3,$$

In general, writing the bit associated to bitline BL<i> may be performed simultaneously to writing the bit associated to bitline BL<2n−1−i>. In practice, cells arranged symmetrically with respect to a middle point of the wordline are accessed simultaneously.

Figure 8:
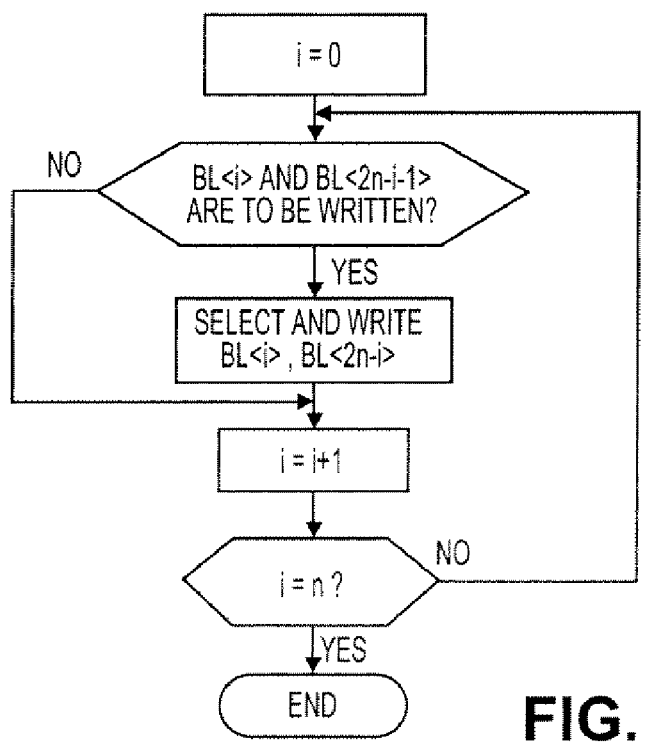
FIG. 8 is a flowchart showing the basic steps for addressing cells to be written according to an embodiment of the present method, in the case of simultaneous writing of two data.

FIG. 8 shows a flow-chart representing the steps usable to write all the bits of two data in a tile according to the above discussed method.

During reading, the memory cells 3 are preferably accessed using the same method of selecting symmetrical cells 3.

Figure 1:
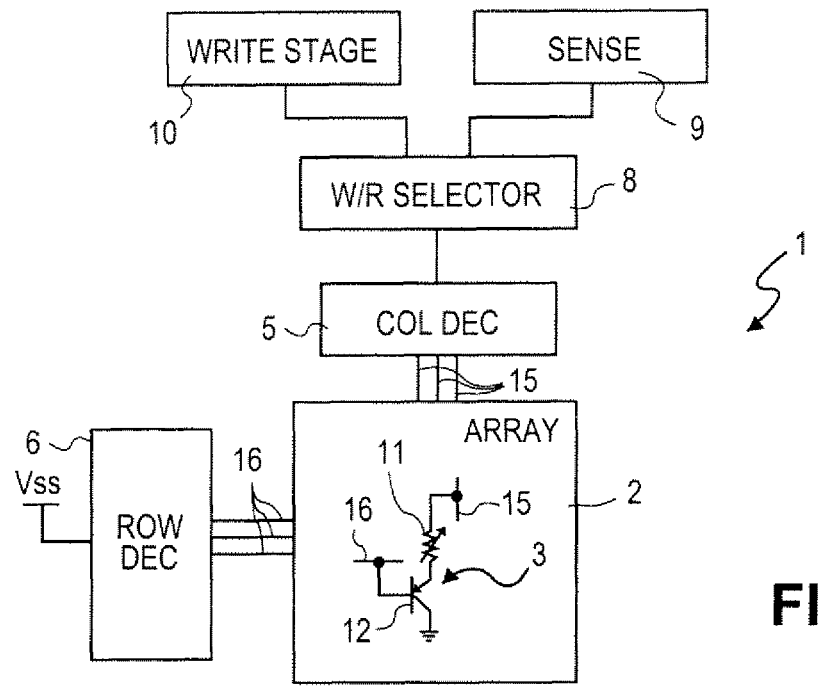
FIG. 1 shows the general structure of a phase change memory device.
Figure 2:
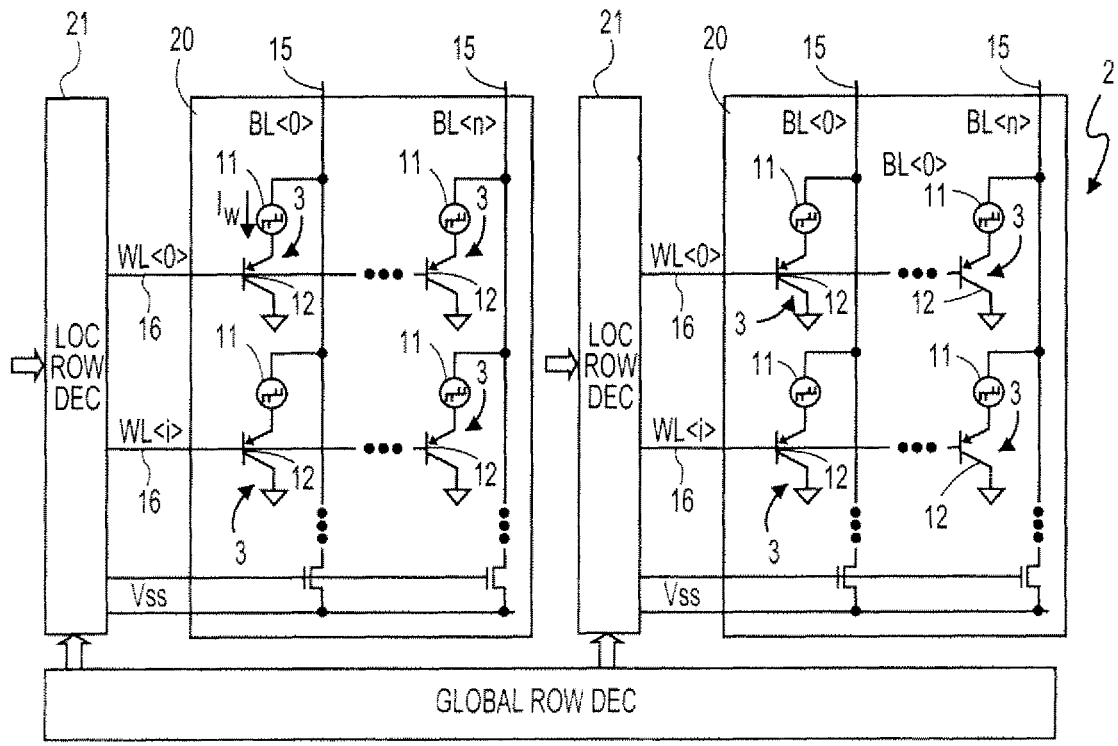
FIG. 2 shows the structure of a memory array of the memory device of FIG. 1.
Figure 3:
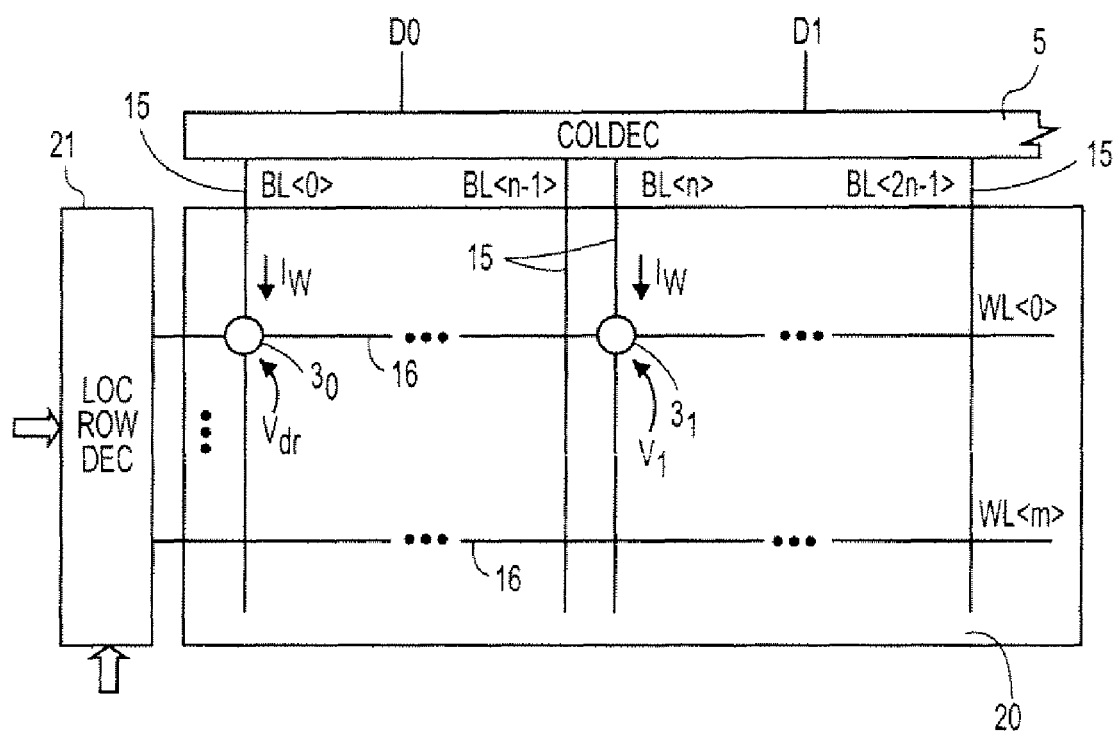
FIGS. 3 and 4 are diagrams of a portion of the memory array of FIG. 2, showing selection of different cells during writing.
Figure 4:
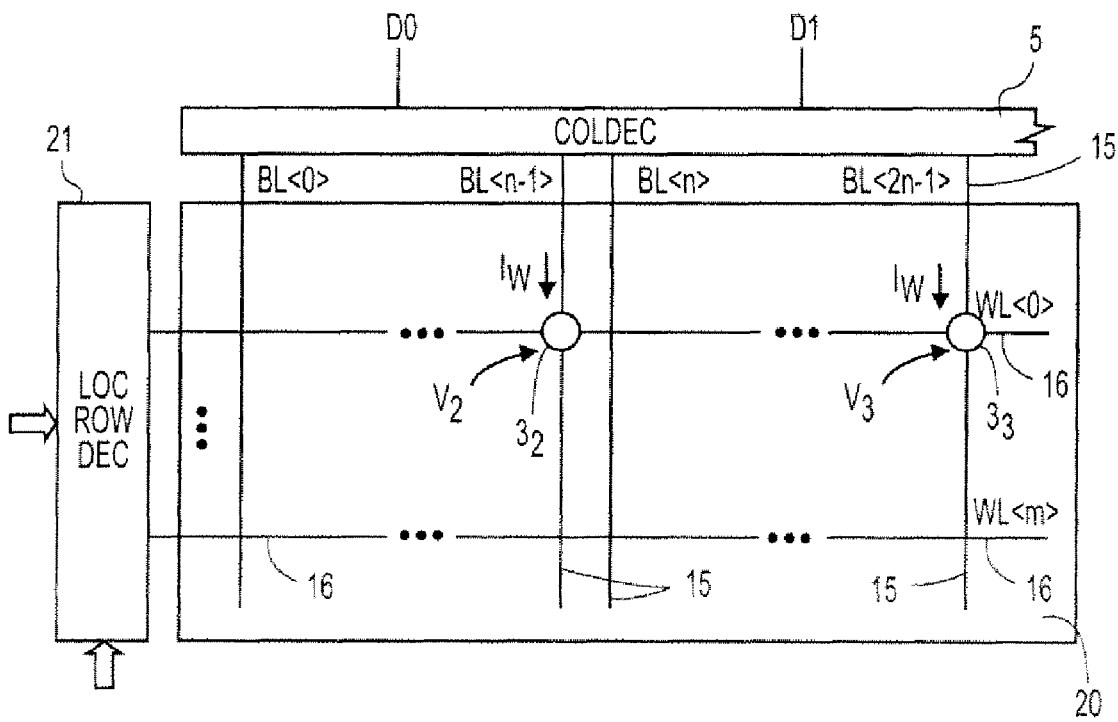

With such a solution, the worst case voltage on the selected wordline is smaller than with the writing technique of FIGS. 3 and 4. In detail, the voltage reduction DV is:

$$DV=V3-V4=Vdr+(3/2)R*Iw/\beta-(Vdr+R*Iw/\beta)$$
$$=\tfrac{1}{2}R*Iw/\beta$$

For example, if Vdr=0.3 V, R=1000Ω, Iw=500 μA and β=2, the obtainable voltage reduction DV is 0.125 mV.

Figure 7:
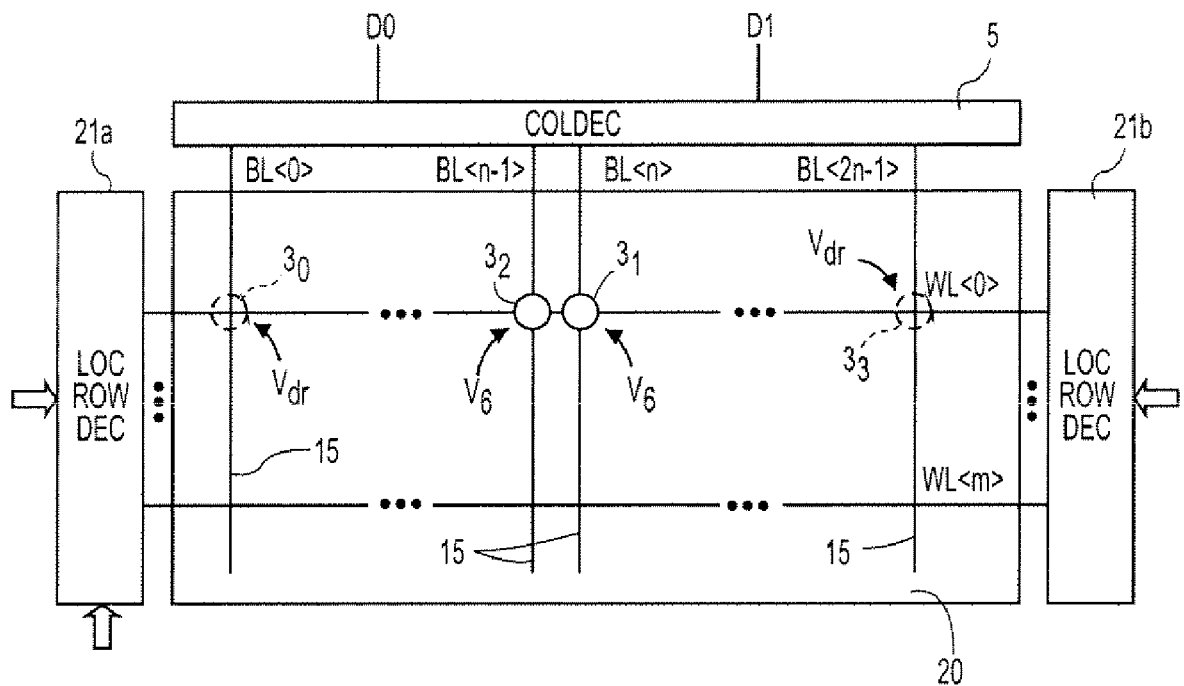
FIG. 7 is a diagram of a portion of a different memory array, showing selection of different cells during writing according an embodiment of the present method.

The same solution can be applied to memory devices having two local row decoders, 21a, 21b, arranged on either side of the tile 20, as shown in FIG. 7.

In this situation, the voltages on the control terminals of cells $3_0$ and $3_3$ are both equal to Vdr, and the voltages V6 on the control terminals of cells $3_2$ and $3_1$ are:

$$V6=Vdr+\tfrac{1}{2}RIw/\beta<V4$$

In this case, the voltage reduction DV is:

$$DV=RIw/\beta.$$

The same technique may be also applied to the writing of three or more data on a same wordline. E.g., for writing three data D0, D1 and D2, when the bit associated to bitline BL<i> of D0 is written, the bits associated to bitlines BL<2n−1−i> of D1 and BL<3n−1−i> of D2 may be written simultaneously. In the alternative when the bit associated to bitline BL<i> of D0 is written, the bits associated to bitlines BL<2n−1−i> of D1 and BL<2n+i> of D2 (or the bits associated to bitlines BL<n+i> of D1 and BL<3n−1−i> of D2) may be written simultaneously, again reducing the maximum voltage drop on the selected wordline.

As demonstrated above, the present access method allows a reduction in the current flowing along the selected wordlines, and thus the voltage drop across such wordlines. Consequently, the present memory device has a low dissipation.

Figure 9:
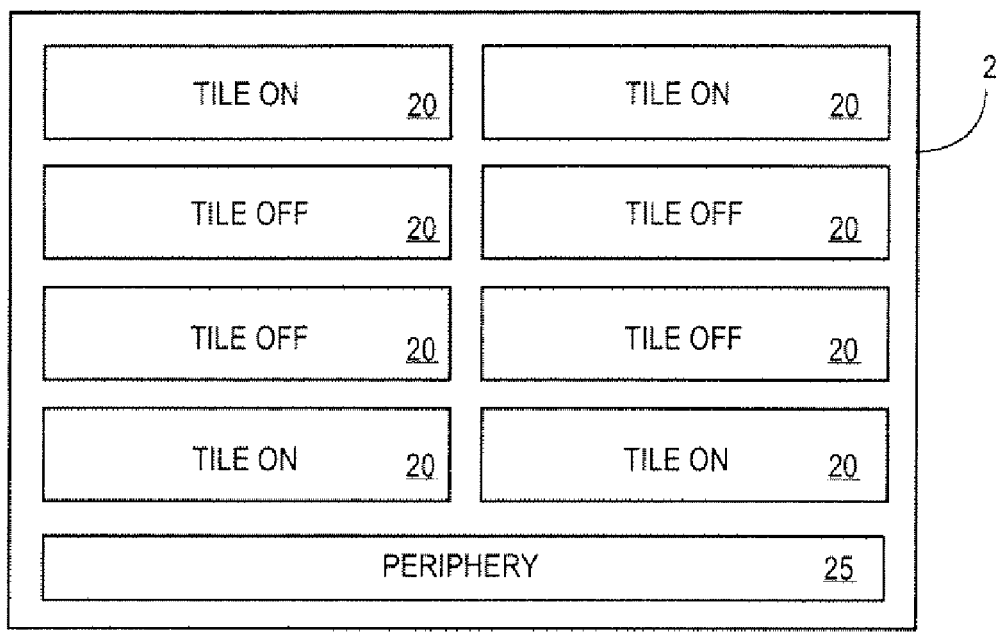
FIGS. 9 and 10 are schematic depictions of a memory array, in two different operating conditions.
Figure 10:
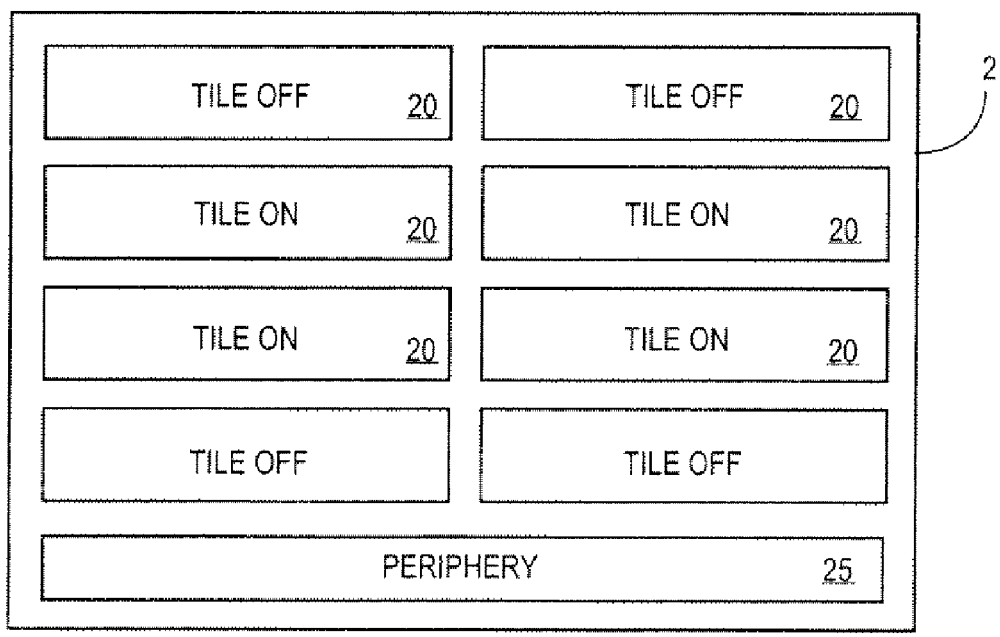

FIGS. 9 and 10 show possible ways of addressing different tiles 20 of a phase-change memory device 1, using the same approach above discussed for the bitlines. Here, the local row decoders 21 have not been shown, and a periphery block 25 represents the other circuits necessary for the operation of the phase-change memory device 1, including the row and column decoders Couples of tiles 20 are arranged on a same horizontal line, and several couples of tiles 20 are overlaid to each other. Here, each tile 20 may comprise any number of wordlines, with one wordline in each couple of tiles 21 being address at a time.

In detail, in FIG. 91 when the couple of tiles 20 which is nearest to the periphery block 25 is accessed, also the couple of tiles 20 which is furthest from periphery block 25 is accessed. When instead the second nearer couple of tiles 20 is accessed, FIG. 10, the other middle couple of tiles (third line from the periphery block 25) is also accessed. In general if m couples of tiles 20 are provided, when the i-th couple (in order from the periphery block 25) is accessed, also the (m−i+1)-th couple is accessed.

Thereby, the voltage drop along the bitlines can be reduced when, due to the required power or other reasons, it is not possible to access all the tiles simultaneously.

Figure 11:
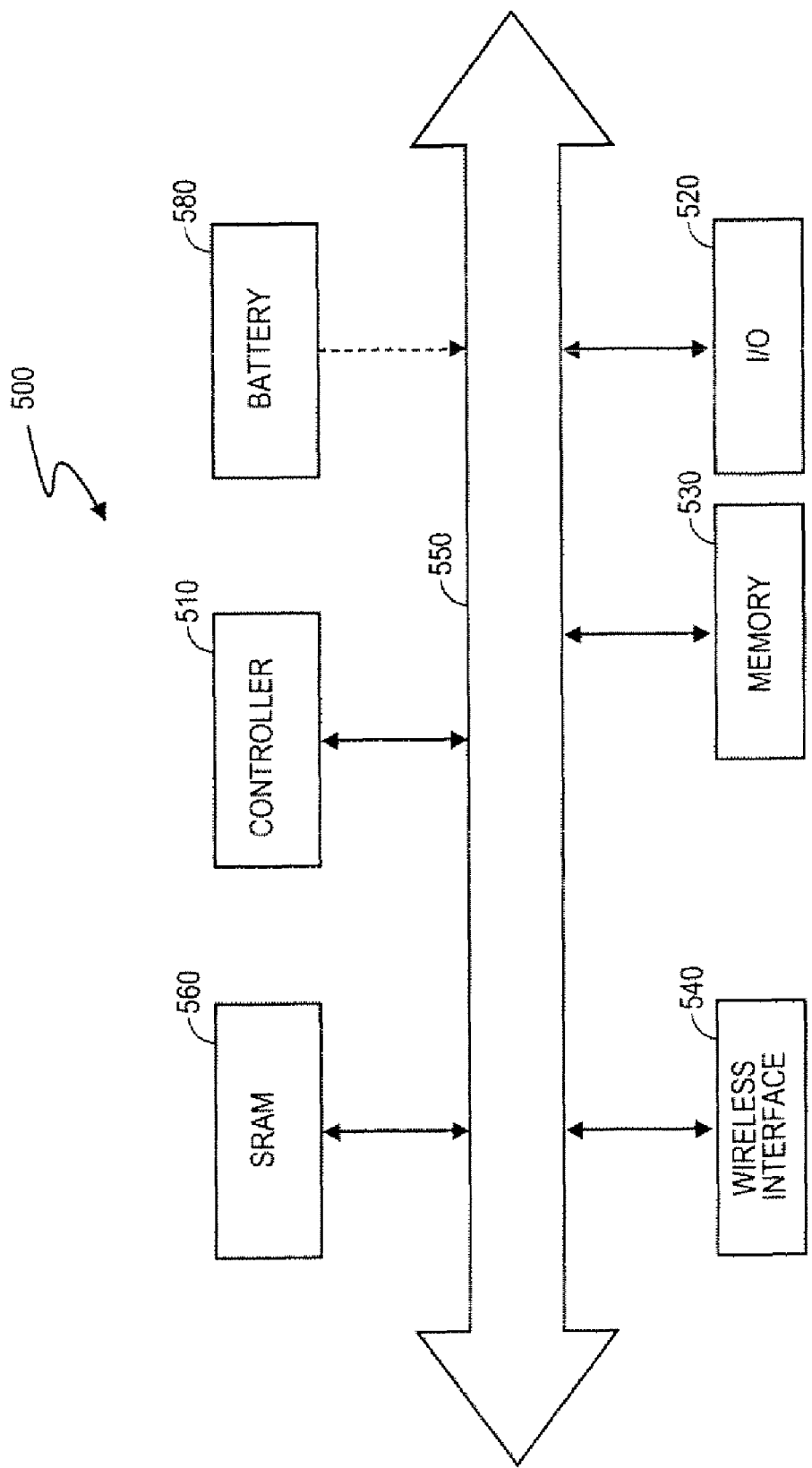
FIG. 11 is a system depiction for another embodiment of the invention.

Turning to FIG. 11, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 includes a controller 510, an input/output (I/O) device 520 (e.g. a keypad, display), static random access memory (SRAM) 560, a memory 530, and a wireless interface 540 coupled to each other via a bus 550. A battery 580 is used in some embodiments. It should be noted that the scope of the present invention is not limited to embodiments having any or all of these components.

Controller 510 comprises, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a phase change memory including the memory array 1 discussed herein.

I/O device 520 may be used by a user to generate a message. System 500 uses wireless interface 540 to transmit and receive messages to and from a wireless communication network with a radio frequency (RF) signal. Examples of wireless interface 540 may include an antenna or a wireless transceiver, although the scope of the present invention is not limited in this respect.

Finally, it is clear that numerous variations and modifications may be made to the phase change memory cell and writing process described and illustrated herein, all falling within the scope of the invention as defined in the attached claims. In particular, it is stressed that herein the term "simultaneously selecting" is meant to include a situation when a second bitline or a second line of tiles is selected while a first bitline or a first line of tiles is still selected, not being necessary that the selection occurs exactly at the same time.

The invention claimed is:

1. A method for accessing a phase change memory device, comprising:
   providing a plurality of phase change memory cells connected at crosspoints of a plurality of bitlines and a plurality of wordlines;
   grouping a first sub-plurality of bitlines in a first group and a second sub-plurality of bitlines in a second group;
   selecting at least a bitline in the first and second groups;
   supplying currents to the selected bitlines;
   biasing a selected wordline,
   wherein selecting at least a bitline in the first and second groups comprises selecting a first bitline in the first group and, while the first bitline is selected, selecting a second bitline in the second group which is arranged on the selected wordline symmetrically to the first bitline in the first group.

2. A method according to claim 1 wherein grouping a first sub-plurality and grouping a second sub-plurality comprise grouping $n$ bitlines in each sub-plurality, selecting the first bitline in the first group comprises selecting bitline BL<$i$> in the first group and selecting the second bitline comprises selecting bitline BL<$2n-1-i$> in the second group.

3. A method according to claim 1 further comprising deselecting the first and the second bitline, selecting a third bitline in the first group, different from the first bitline, and, while the third bitline is still selected, selecting a fourth bitline in the second group which is arranged symmetrically to the third bitline in the first group.

4. A method according to claim 1 wherein grouping a first sub-plurality and grouping a second sub-plurality comprise grouping $n$ bitlines in each sub-plurality, the method further comprising repeating the step of selecting symmetrical bitlines in the first and second sub-pluralities until reaching an n-th bitline in the first group.

5. A method according to claim 1 further comprising grouping a third sub-plurality of bitlines in a third group adjacent to the first and the second group, wherein when the first and second bitlines are still selected, selecting a bitline in the third group, the bitline in the third group being arranged symmetrically to a bitline in the first or the second group.

6. A method according to claim 1 further comprising writing phase change memory cells connected to the selected bitlines.

7. A method according to claim 1 further comprising reading phase change memory cells connected to the selected bitlines.

8. A method according to claim 1 further comprising:
   providing a plurality of tiles aligned along a direction and coupled to a periphery circuitry, each tile including at least one wordline,
   addressing a first tile and, while the first tile is still selected, selecting a second tiles arranged symmetrically to said first tile along said direction.

9. A phase change memory device comprising:
   a plurality of bitlines (BL) including a first group of bitlines and a second group of bitlines;
   a plurality of wordlines (WL), crossing the bitlines;
   a plurality of phase change memory cells connected at crosspoints of the bitlines and the wordlines;
   a selecting stage for selecting at least a bitline in the first and in the second groups;
   a current generator to supply access current to the selected bitlines;
   a biasing stage for biasing a selected wordline,
   wherein said selecting stage comprises means for selecting a first bitline in the first group and, while the first bitline is still selected, selecting in the second group a second bitline which is arranged symmetrically to the first bitline in the first group.

10. A phase change memory according to claim 9 wherein the first and the second groups comprise each $n$ bitlines, wherein the selecting stage comprises means for sequentially selecting a bitline BL<$i$> in the first group and a bitline BL<$2n-1-i$> in the second group.

11. A phase change memory according to claim 9 wherein the current generator comprises a write stage.

12. A phase change memory according to claim 9 wherein the current generator comprise a sensing stage.

13. A phase change memory according to any of claim 9 wherein said wordlines are grouped in a plurality of tiles aligned along a direction and coupled to a periphery circuitry, the memory comprising means for addressing a first tile and for addressing a second tiles which is arranged symmetrically along said direction while the first tile is still addressed.

* * * * *